United States Patent
Balakrishnan et al.

(10) Patent No.: US 9,793,263 B1
(45) Date of Patent: Oct. 17, 2017

(54) DIGITAL ALLOY FINFET CO-INTEGRATED WITH PASSIVE RESISTOR WITH GOOD TEMPERATURE COEFFICIENT

(71) Applicant: International Business Machines Corporation, Armonk, NY (US)

(72) Inventors: Karthik Balakrishnan, White Plains, NY (US); Stephen W. Bedell, Wappingers Falls, NY (US); Pouya Hashemi, White Plains, NY (US); Bahman Hekmatshoartabari, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/164,092

(22) Filed: May 25, 2016

(51) Int. Cl.
| | | |
|---|---|---|
| H01L 27/11 | (2006.01) |
| H01L 27/06 | (2006.01) |
| H01L 29/78 | (2006.01) |
| H01L 29/10 | (2006.01) |
| H01L 49/02 | (2006.01) |
| H01L 29/161 | (2006.01) |
| H01L 29/201 | (2006.01) |
| H01L 21/8234 | (2006.01) |
| H01L 29/66 | (2006.01) |
| H01L 21/225 | (2006.01) |
| H01L 21/24 | (2006.01) |

(52) U.S. Cl.
CPC ........ *H01L 27/0629* (2013.01); *H01L 21/225* (2013.01); *H01L 21/242* (2013.01); *H01L 21/823431* (2013.01); *H01L 28/20* (2013.01); *H01L 29/1054* (2013.01); *H01L 29/161* (2013.01); *H01L 29/201* (2013.01); *H01L 29/66545* (2013.01); *H01L 29/785* (2013.01)

(58) Field of Classification Search
CPC .............. H01L 27/0629; H01L 29/161; H01L 29/1054; H01L 21/225; H01L 29/66545; H01L 21/242; H01L 21/823431; H01L 28/20; H01L 29/201; H01L 29/785
See application file for complete search history.

(56) References Cited

U.S. PATENT DOCUMENTS

| 9,425,318 B1 * | 8/2016 | Hoentschel | ......... H01L 29/7851 |
| 2003/0193058 A1 * | 10/2003 | Fried | ....................... H01L 21/84 |
| | | | 257/200 |

(Continued)

OTHER PUBLICATIONS

Lee, B. et al., "Performance enhancement on sub-70nm strained silicon SOI MOSFETs on Ultra-thin Thermally Mixed Strained silicon/SiGe on Insulator(TM-SGOI) substrate with Raised S/D", Electron Devices Meeting, IEDM, Dec. 2002, pp. 946-948.

(Continued)

*Primary Examiner* — Victor A Mandala
(74) *Attorney, Agent, or Firm* — Scully, Scott, Murphy & Presser, P.C.; Louis J. Percello, Esq.

(57) ABSTRACT

A method for integrating fin field effect transistors (FinFETs) and resistors on a common substrate is provided. By employing a digital alloy as a channel material for each FinFET and as a resistor body for each resistor, FinFETs with improved charge carrier mobility, and resistors with good temperature coefficient of resistance are obtained.

20 Claims, 13 Drawing Sheets

(56) References Cited

U.S. PATENT DOCUMENTS

| | | |
|---|---|---|
| 2004/0004271 A1 | 1/2004 | Fukuda et al. |
| 2009/0057765 A1* | 3/2009 | Zhu ................. H01L 21/823842 257/351 |
| 2015/0263097 A1* | 9/2015 | Cheng ................... H01L 29/165 257/192 |
| 2016/0372552 A1* | 12/2016 | Balakrishnan ........ H01L 29/785 |
| 2017/0005176 A1* | 1/2017 | Sung ................... H01L 21/3065 |

OTHER PUBLICATIONS

Asen-Palmer, M. et al., "Thermal conductivity of germanium crystals with different isotopic compositions", Physical Review B, vol. 56, No. 15, Oct. 15, 1997, pp. 9431-9447.

* cited by examiner

DIGITAL ALLOY FINFET CO-INTEGRATED WITH PASSIVE RESISTOR WITH GOOD TEMPERATURE COEFFICIENT

BACKGROUND

The present application relates to semiconductor device fabrication, and more particularly, to the fabrication of fin field effect transistors (FinFETs) and passive resistors on a common substrate.

Field effect transistors (FETs) utilizing semiconductor alloys such as silicon germanium (SiGe) as channel materials have exhibited increased charge carrier mobility compared to conventional silicon-based FETs. However the semiconductor alloys are typically formed as random alloys and phenomenon such as alloy scattering contributes to decreased channel mobility. In addition, and since thermal conductivity of the random semiconductor alloys is lower than that of the silicon, the heat dissipation problem in theses semiconductor alloy-based FETs becomes more serious. Therefore, there remains a need for developing semiconductor alloy-based FETs with improved charge carrier mobility and thermal conductivity.

Resistors are passive devices commonly employed in integrated circuits (ICs) for protection, operation and/or current control of electric components such as FETs in ICs. However, the resistance of the resistors tends to fluctuate with temperatures during operation; resistance fluctuation hampers the performance of IC devices. Therefore, there remains a need for developing resistors with good temperature coefficient of resistance during use.

SUMMARY

The present application provides a method of integrating a FinFET having a channel portion composed of a digital alloy, and a passive resistor having a resistor body composed of the same digital alloy on a common substrate. The digital alloy provides improved carrier mobility and thermal conductivity for better heat dissipation. As a result, FETs with improved charge carrier mobility, and resistors with good temperature coefficient of resistance can be obtained.

In one aspect of the present application, a semiconductor structure is provided. The semiconductor structure includes a FinFET located in a first region of a substrate, and a resistor located in a second region of the substrate. The FinFET includes a digital alloy channel portion composed of alternating sublayers of a first semiconductor material and a second semiconductor material different from the first semiconductor material, and source/drain regions laterally surrounding the digital alloy channel portion. The resistor includes a digital alloy resistor body portion composed of alternating sublayers of the first semiconductor material and the second semiconductor material, and semiconductor resistor contact portions laterally surrounding the digital alloy resistor body portion.

In another aspect of the present application, a method of forming a semiconductor structure is provided. The method includes forming a FinFET in a first region of a substrate and a resistor in a second region of the substrate. The FinFET includes a digital alloy channel portion composed of alternating sublayers of a first semiconductor material and a second semiconductor material different from the first semiconductor material, and source/drain regions laterally surrounding the digital alloy channel portion. The resistor includes a digital alloy resistor body portion composed of alternating sublayers of the first semiconductor material and the second semiconductor material, and semiconductor resistor contact portions laterally surrounding the digital alloy resistor body portion.

DETAILED DESCRIPTION

Figure 1:
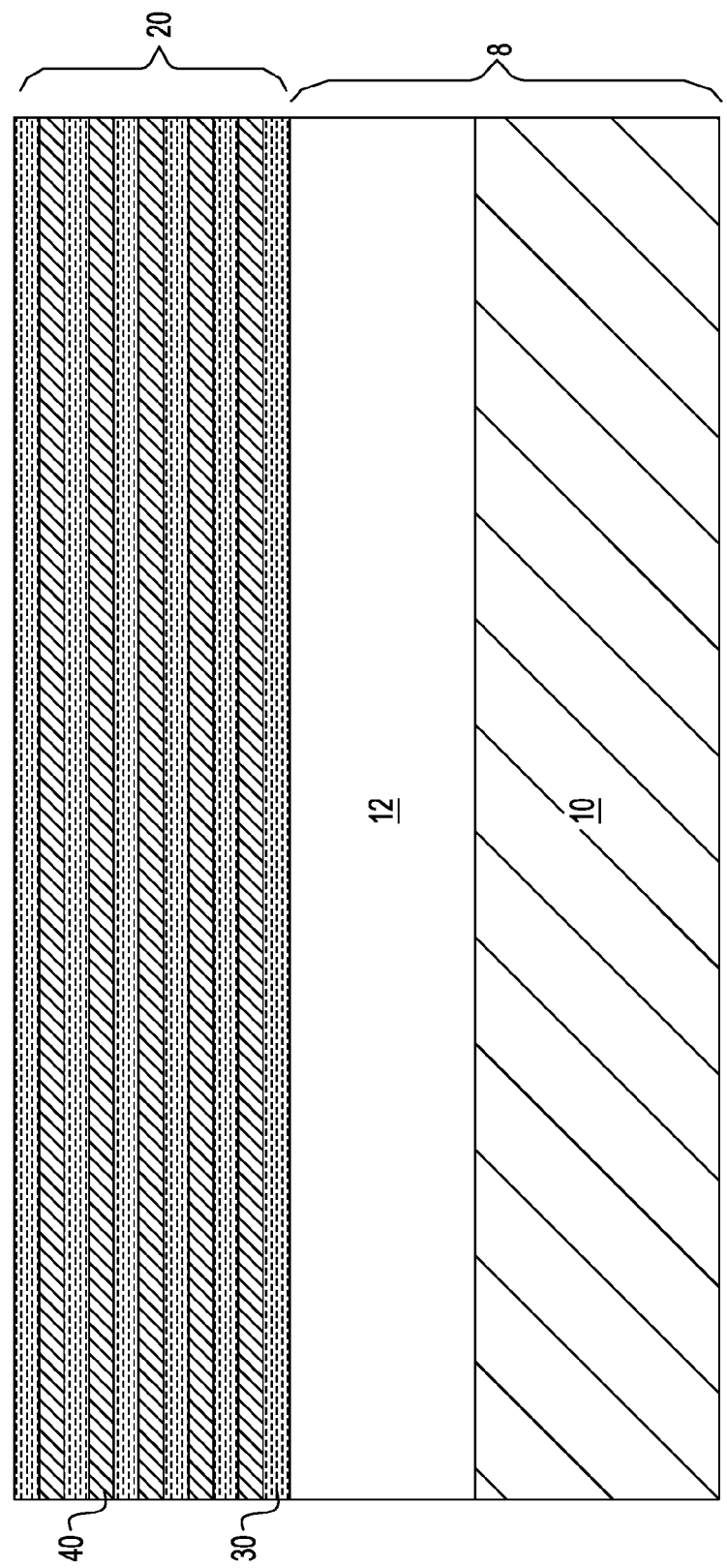
FIG. 1 is a cross-sectional view of an exemplary semiconductor structure including a digital alloy layer formed over a top surface of a substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, an exemplary semiconductor structure that can be employed in an embodiment of the present application includes a substrate 8 and a digital alloy layer 20 formed thereon. As used herein, the term "digital alloy" means a material having a uniform average composition formed by stacking of individual layers. A digital alloy typically possesses superior carrier transport characteristics and better thermal conductivity compared to a random alloy of the same average composition. In one embodiment of the present application, the digital alloy layer 20 includes alternating sublayers of a first semiconductor material (herein referred to as first semiconductor material sublayers 30) and a second semiconductor material (herein referred to as second semiconductor material sublayers 40). The second semiconductor material is different from the first semiconductor material.

The substrate 8 can be provided from a semiconductor-on-insulator (SOI) substrate or a bulk semiconductor substrate including a bulk semiconductor material throughout. In one embodiment and as shown in FIG. 1, the substrate 8 is formed from a SOI substrate including, from bottom to top, a handle substrate 10, a buried insulator layer 12 and a top semiconductor layer that constitutes a bottommost sublayer of the digital alloy layer 20. In another embodiment and when the substrate 8 is formed from a bulk semiconductor substrate, an upper portion of the bulk semiconductor substrate constitutes the bottommost sublayer of the digital alloy layer 20 (not shown).

The handle substrate 10 may include a semiconductor material such as, for example, Si, Ge, SiGe, SiC, SiGeC, a III-V compound semiconductor, a II-VI compound semiconductor or any combinations thereof. The handle substrate 10 provides mechanical support to the overlying structures, such as the buried insulator layer 12 and the digital alloy layer 20. The thickness of the handle substrate 10 can be from 30 µm to about 2 mm, although less and greater thicknesses can also be employed.

The buried insulator layer 12 may include a dielectric material such as silicon dioxide, silicon nitride, silicon oxynitride, boron nitride or a combination thereof. In one embodiment, the buried insulator layer 12 may be formed by a deposition process, such as chemical vapor deposition (CVD), plasma enhanced chemical vapor deposition (PECVD) or physical vapor deposition (PVD). In another embodiment, the buried insulator layer 12 may be formed using a thermal growth process, such as thermal oxidation, to convert a surface portion of the handle substrate 10. In yet another embodiment, the buried insulator layer 12 can also be formed by implanting oxygen atoms into a bulk semiconductor substrate and thereafter annealing the structure. The thickness of the buried insulator layer 12 can be from 50 nm to 200 nm, although lesser and greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, and III/V compound semiconductors such as, for example, InAs, GaAs and AlAs. Typically, the top semiconductor layer is composed of a single crystalline semiconductor material, such as, for example, single crystalline silicon. The top semiconductor layer can be formed by a deposition process, such as CVD or PECVD, or it can represent an uppermost portion of a bulk substrate in which oxygen atoms used to form the buried insulating layer 12 are implanted therein. Alternatively, the top semiconductor layer may initially be formed on a carrier substrate (not shown) and then bonded to the substrate 8 from the buried insulator layer 12 side. The top semiconductor layer may be thinned to a desired thickness so as to be employed as the bottommost sublayer of the digital alloy layer 20 by planarization, grinding, etching, oxidation followed by oxide etch. The top semiconductor layer that is formed may have a thickness from 0.5 nm to 2 nm, although lesser and greater thicknesses can also be employed.

After providing the SOI substrate, the first and the second semiconductor material sublayers 30, 40 are sequentially formed on the top semiconductor layer of the SOI substrate to form the digital alloy layer 20. As stated above, the bottommost semiconductor material sublayer of the digital alloy layer 20 is comprised of the top semiconductor layer of the SOI substrate (designated as 30). Typically, the topmost semiconductor material sublayer (designated as 30) in the digital alloy layer 20 is composed of a same material as the bottommost semiconductor material sublayer 30. In one embodiment, each of the first semiconductor material and the second semiconductor material can be independently selected from an elemental semiconductor material, which can be one of Si and Ge, thus forming a digital alloy layer 20 composed of a digital alloy of SiGe. In another embodiment, each of the first semiconductor material and the second semiconductor material can be independently selected from a III-V compound semiconductor material, which can be one of InAs, GaAs, AlAs, thus forming a digital alloy layer 20 composed of a digital alloy of InGaAs, InAlAs or AlGaAs.

The first and the second semiconductor material sublayers 30, 40 in the digital alloy layer 20 may be formed utilizing an epitaxial growth (or deposition) process. The term "epitaxial growth or deposition" means the growth of a semiconductor material on a deposition surface of a semiconductor material, in which the semiconductor material being grown has the same crystalline characteristics as the semiconductor material of the deposition surface. For example, an epitaxial semiconductor material deposited on a $\{100\}$ surface will take on a $\{100\}$ orientation. Thus, in the present application, each first semiconductor material sublayer 30 and each second semiconductor material sublayer 40 has an epitaxial relationship, i.e., same crystal orientation, with the underlying semiconductor material layer. Thus, and when the top semiconductor layer of the SOI substrate (i.e., the bottommost semiconductor material sublayer 30) is comprised of a single crystalline material, each of the first and the second semiconductor material sublayers 30, 40 in the digital alloy layer 20 formed thereupon is comprised of a single crystalline material. In one embodiment, each of the first and the second semiconductor material sublayers 30, 40 may be formed by CVD or molecular beam epitaxy (MBE).

In some embodiments, the digital alloy formed in the digital alloy layer 20 may be isotopically enriched by flowing isotope enriched source gases into the deposition chamber. The term "isotopically enriched" source gas means the source gas contains a distribution of mass isotopes different from the naturally occurring isotopic distribution, whereby one of the mass isotopes has an enrichment level higher than that present in the naturally occurring level. By minimize isotopic mass variance in the individual first and second semiconductor sublayers 30, 40, the carrier transport characteristics and thermal conductivity of the digital alloy layer 20 can be further improved.

Each of the first and the second semiconductor material sublayers 30, 40 may have a thickness ranging from 0.5 nm to 2 nm. The relative thickness of the first and the second semiconductor material sublayers 30, 40 is adjusted in accordance with the desired composition ratio. For example, in instances where the digital alloy layer 20 includes a digital alloy of SiGe, if a 1:1 composition ratio of Si/Ge is desired, each of the first and the second semiconductor material sublayers 30, 40 is typically 1 nm in thickness. The first and the second semiconductor material sublayers 30, 40 are deposited until a desired total thickness of the digital alloy layer 20 is reached. The total thickness of the digital alloy layer 20 can be from 10 nm to 100 nm, although lesser and greater thicknesses can also be employed.

The digital alloy layer 20 can be intrinsic or can contain dopants of a first conductivity type which can be p-type or n-type. If the first conductivity type is p-type, the dopants can be, for example, B, Al, Ga or In. If the first conductivity type is n-type, the dopants can be, for example, P, As, or Sb. The concentration of the dopants in the digital alloy layer 20 may range from $1.0\times10^{15}$ atoms/cm$^3$ to $3.0\times10^{17}$ atoms/cm$^3$, although lesser and greater dopant concentrations can also be employed.

Figure 2:
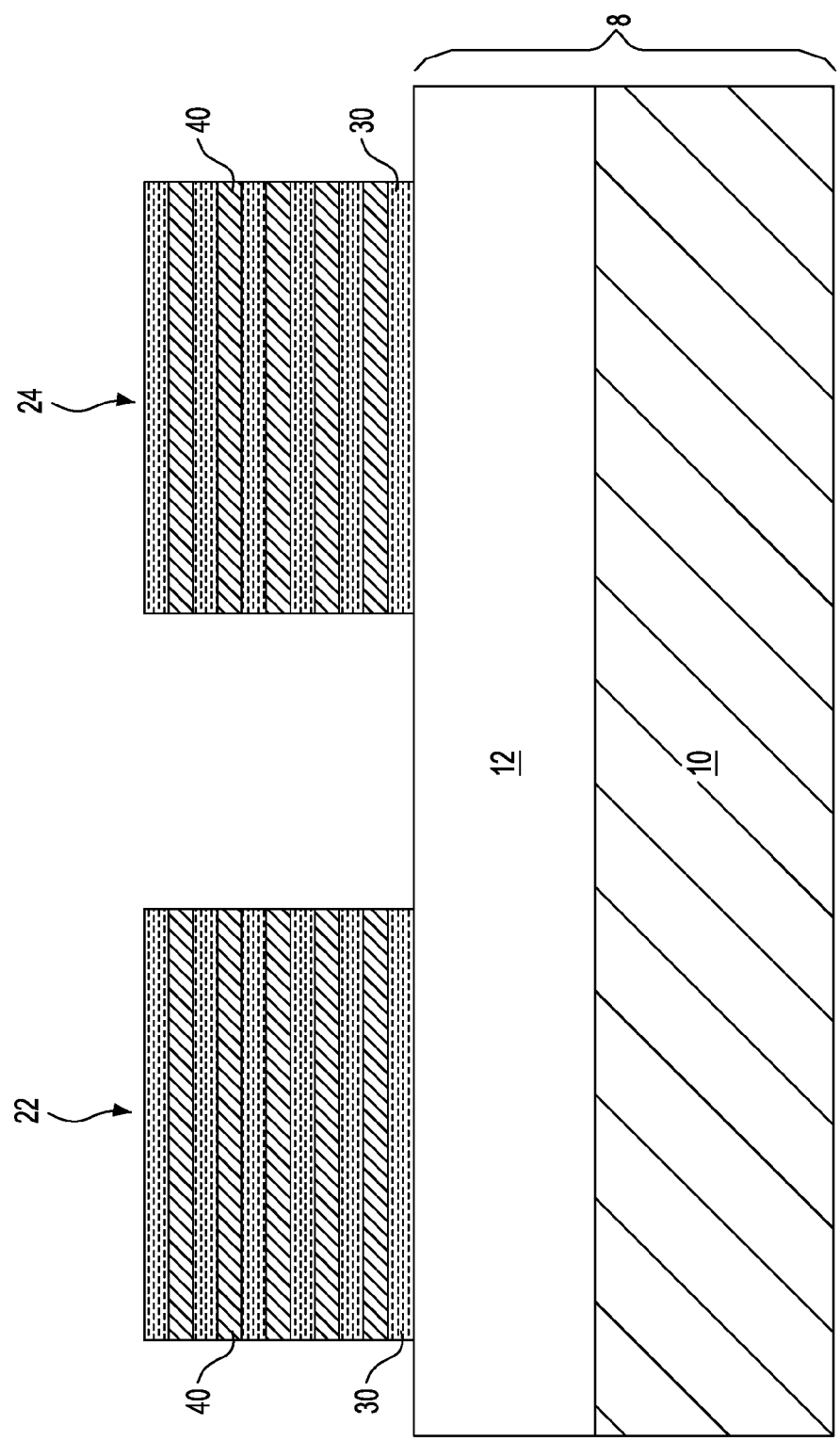
FIG. 2 is a cross-sectional view of the exemplary semiconductor structure of FIG. 1 after forming a first digital alloy portion in an active device region of the substrate and a second digital alloy portion in a passive device region of the substrate.

Referring to FIG. 2, the digital alloy layer 20 is patterned to form at least one first digital alloy portion 22 in an active device region of the substrate 8, and at least one second digital alloy portion 24 in a passive device region of the substrate 8. The at least one first digital alloy portion 22 is a fin-shaped portion for formation of FinFETs. As used herein, a "fin" is a structure that has a first pair of sidewalls along a lengthwise direction that is longer than a second pair of sidewalls along a widthwise direction. The first digital alloy portion 22 may have a rectangular shape in cross-section. The first digital alloy portion 22 can have a width ranging from 5 nm to 100 nm, although lesser and greater widths can also be employed. The spacing between adjacent first digital alloy portions 22 may be from 50 nm to 200 nm, although lesser and greater spacing can also be employed. The second digital alloy portion 24, from which a resistor can be formed, typically has a dimension greater than the first digital alloy portion 22. For example, the second digital alloy portion 24 may have a width ranging from 20 nm to 1 μm, although lesser and greater widths can also be employed.

The first and the second digital alloy portions 22, 24 can be formed by first applying a photoresist layer (now shown) over the topmost surface of the digital alloy layer 20 and lithographically patterning the photoresist layer such that remaining portions of the photoresist layer cover portions of the digital alloy layer 20 where the first and the second digital alloy portions 22, 24 are to be formed. Subsequently, the pattern in the photoresist layer is transferred through the digital alloy layer 20 by an anisotropic etch. The anisotropic etch can be a dry etch such as, for example, reactive ion etch (RIE) or a wet etch. After the anisotropic etch, each portion of the digital alloy layer 20 that remains in the active device region constitutes a first digital alloy portion 22, and each portion of the digital alloy layer 20 that remains in the passive device region constitutes a second digital alloy portion 24. Each of the first and the second digital alloy portions 22, 24 is composed of alternating first semiconductor material sublayers 30 and second semiconductor material sublayers 40. The remaining portions of the photoresist layer can be removed utilizing a conventional resist stripping process such as, for example, ashing.

Alternatively, the first and the second digital alloy portions 22, 24 can be formed utilizing a sidewall image transfer (SIT) process. In a typical SIT process, spacers are formed on a sacrificial mandrel. The sacrificial mandrel is removed and the remaining spacers are used as a hard mask to etch the digital alloy layer 20. The spacers are then removed after the first and the second digital alloy portions 22, 24 have been formed. The first and the second digital alloy portions 22, 24 can also be formed utilizing a direct self-assembly patterning process.

Figure 3:
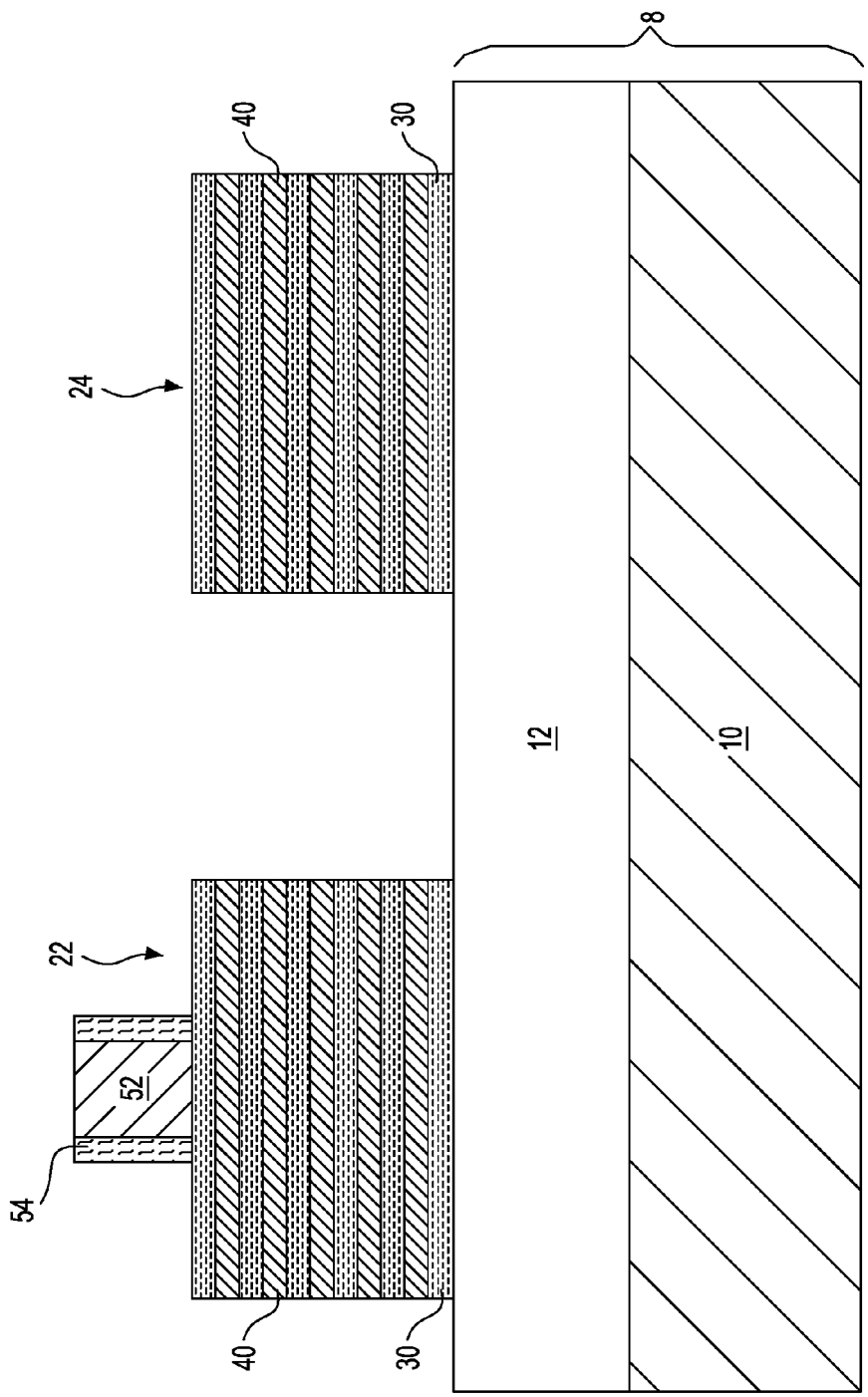
FIG. 3 is a cross-sectional view of the exemplary semiconductor structure of FIG. 2 after forming a sacrificial gate structure over a portion of the first digital alloy portion.

Referring to FIG. 3, a sacrificial gate structure is formed in the active device region straddling a portion of the at least one first digital alloy portion 22. The sacrificial gate structure includes a sacrificial gate 52 and a gate spacer 54 present on sidewalls of the sacrificial gate 52. The sacrificial gate 52 may include a stack of, from bottom to top, a sacrificial gate dielectric, a sacrificial gate conductor and a sacrificial gate cap (not shown). In some embodiments of the present application, the sacrificial gate dielectric and/or the sacrificial gate cap can be omitted.

The sacrificial gate 52 can be formed by first providing a material stack (not shown) that includes, from bottom to top, a sacrificial gate dielectric layer, a sacrificial gate conductor layer and a sacrificial gate cap layer over the first and the second digital alloy portions 22, 24 and buried insulator layer 12. In some embodiments of the present application and as mentioned above, the sacrificial gate dielectric layer can be omitted. When present, the sacrificial gate dielectric layer includes a dielectric material such as an oxide or a nitride. In one embodiment, the sacrificial gate dielectric layer is composed of silicon oxide, silicon nitride or silicon oxynitride. The sacrificial gate dielectric layer can be formed by a conventional deposition process, including but not limited to, CVD or PVD. The sacrificial gate dielectric layer can also be formed by conversion of a surface portion of the first digital alloy portion 22. The sacrificial gate dielectric layer that is formed may have a thickness from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The sacrificial gate conductor layer can be formed using CVD or PECVD. The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate 52. Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portion of the material stack that is located in the active device region after the pattern transfer constitutes the sacrificial gate 52. The remaining portion of the photoresist layer may be subsequently removed by, for example, ashing.

The gate spacer 54 may include a dielectric material such as, for example, an oxide, a nitride, an oxynitride, or any combination thereof. For example, the gate spacer 54 may be composed of silicon nitride, silicon boron carbon nitride (SiBCN), or silicon carbon oxynitride (SiOCN). The gate spacer 54 can be formed by first conformally depositing a gate spacer material layer (not shown) on exposed surfaces of the sacrificial gate 52, the first and the second digital alloy portions 22, 24 and the buried insulator layer 12 and then etching the gate spacer material layer to remove horizontal portions of the gate spacer material layer. The gate spacer material layer can be provided by a conformal deposition process including, for example, CVD, PECVD or PVD. The etching of the conformal gate spacer material layer may be performed by a dry etch process such as, for example, RIE. The remaining portion of the gate spacer material layer present on the sidewalls of the sacrificial gate 52 constitutes the gate spacer 54. The width of the gate spacer 54, as measured at the base of the gate spacer 54 can be from 5 nm to 100 nm, although lesser and greater widths can also be employed.

Figure 4:
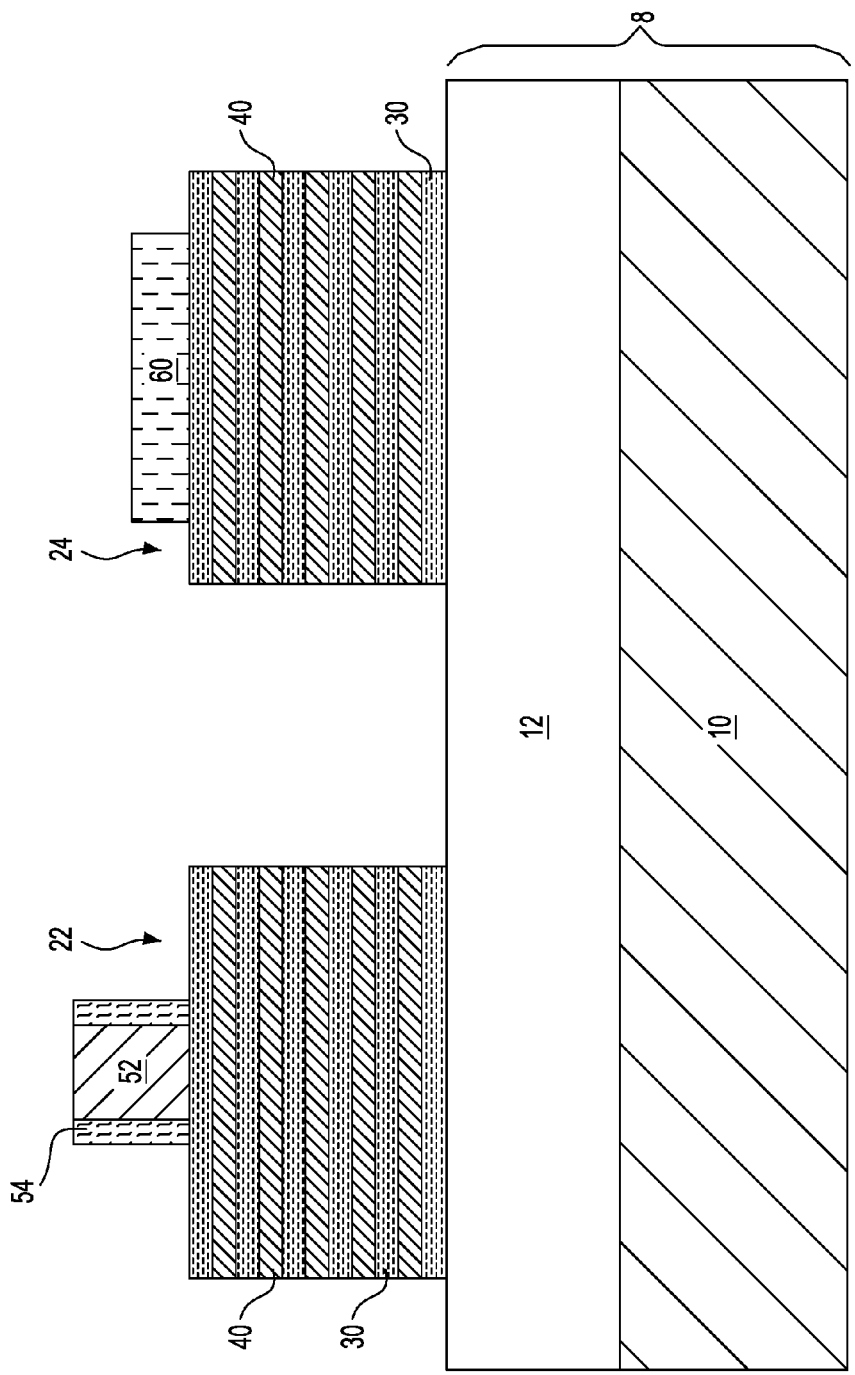
FIG. 4 is a cross-sectional view of the exemplary semiconductor structure of FIG. 3 after forming a mask layer portion over a central portion of the second digital alloy portion.

Referring to FIG. 4, a mask layer portion 60 is formed covering a central portion of the second digital alloy layer portion 24. The mask layer portion 60 can be formed by applying a mask layer (not shown) over the first and the digital alloy layer portions 22, 24, the sacrificial gate structure (52, 54) and the buried insulator layer 12 and lithographically patterning the mask layer. The mask layer may be a photoresist layer or a photoresist layer in conjunction with hard mask layer(s). An anisotropic etch such as, for example, RIE can be employed to remove the material(s) of the mask layer selective to materials of the first and the second digital alloy portions 22, 24, the sacrificial gate structure (52, 54) and the buried insulator layer 12. The remaining portion of the mask layer constitutes the mask layer portion 60.

Figure 5:
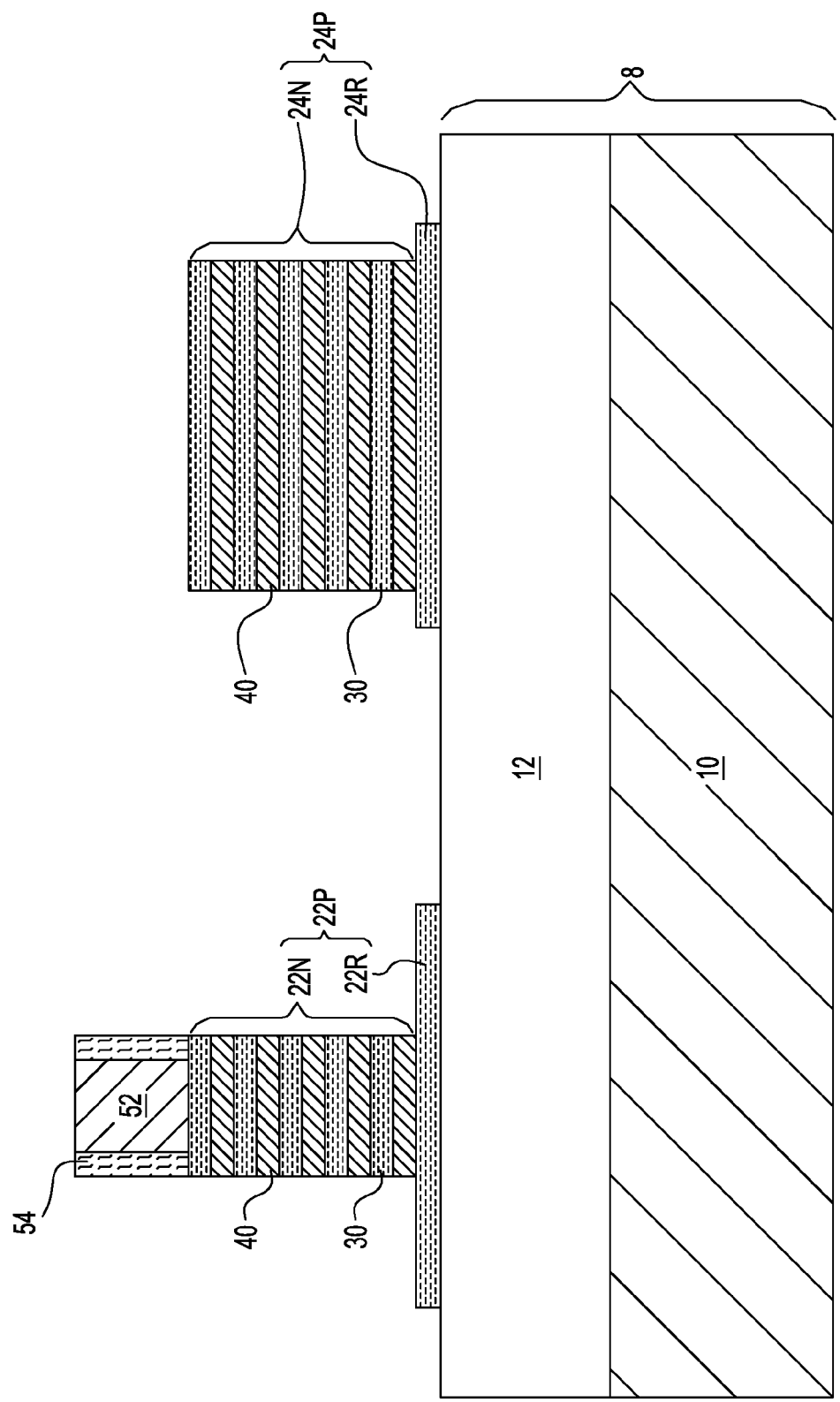
FIG. 5 is a cross-sectional view of the exemplary semiconductor structure of FIG. 4 after recessing portions of the first digital alloy portion that are not covered by the sacrificial gate structure, and recessing portions of the second digital alloy portion that are not covered by the mask layer portion.

Referring to FIG. 5, end portions of the first digital alloy portion 22 that are not covered by the sacrificial gate structure (52, 54), and outer portions of the second digital alloy layer portion 24 that are not covered by the mask layer portion 60 are recessed to form recessed portions in the first digital alloy portion 22, and recessed portions in the second digital alloy portions 24, respectively. The remaining portion of the first digital alloy portion 22 that includes a non-recessed portion (indicated as 22N) and the recessed portions (indicated as 22R) is herein referred to as a digital alloy transistor portion 22P. The remaining portion of the second digital alloy portion 24 that includes a non-recessed portion (indicated as 24N) and the recessed portion (indicated as 24R) is herein referred to as a digital alloy resistor portion 24P.

The first and the second digital alloy portions 22, 24 may be recessed utilizing an anisotropic etch capable of removing the first and second semiconductor materials providing the first and the second digital alloy portions 22, 24 without substantially impacting the surrounding structures, including the sacrificial gate structure (52, 54), the mask layer portion 60 and the buried insulator layer 12. Exemplary anisotropic etches may include RIE and plasma etching. After recess, the mask layer portion 60 may be removed by oxygen-based plasma etching.

Figure 6:
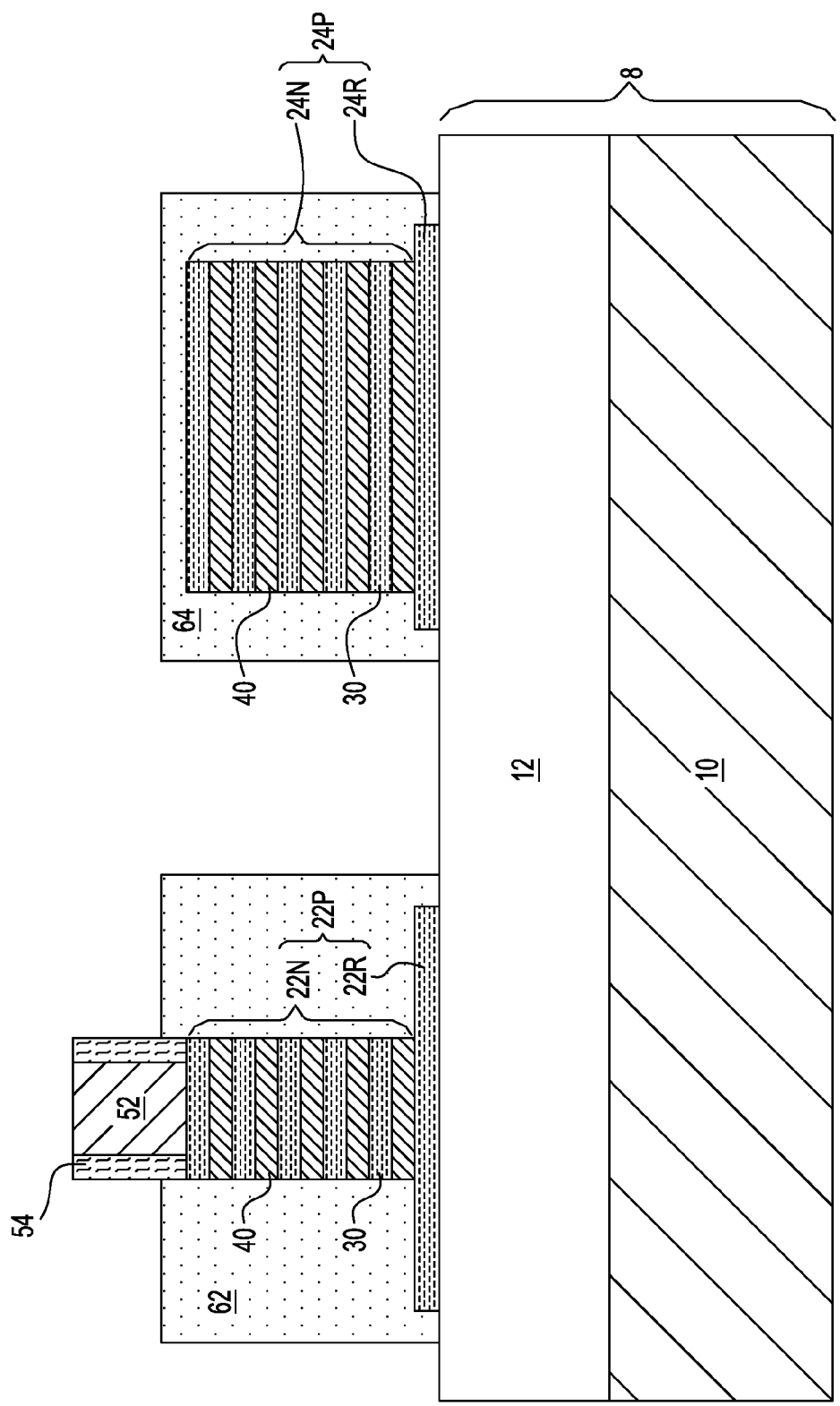
FIG. 6 is a cross-sectional view of the exemplary semiconductor structure of FIG. 5 after forming first semiconductor components on the recessed portions of the first digital alloy portion, and a second semiconductor component on the exposed surfaces of the second digital alloy portion.

Referring to FIG. 6, first semiconductor components 62 are formed on the recessed portions 22R of the digital alloy transistor portion 22P, while a second semiconductor component 64 is formed on the recessed portions 24R and non-recessed portion 24N of the digital alloy resistor portion 24P. The first and the second semiconductor components 62, 64 can be formed by epitaxially depositing a semiconductor material over exposed semiconductor surfaces, i.e., exposed surfaces of the digital alloy transistor portion 22P and exposed surfaces of the digital alloy resistor portion 24P, but not on dielectric surfaces such as the surfaces of the sacrificial gate cap in the sacrificial gate 52, the gate spacer 54 and the buried insulator layer 12. In one embodiment, the selective epitaxy growth process can proceed until the first semiconductor components 62 merge neighboring digital alloy transistor portions 22P (not shown). Exemplary semiconductor materials that can be employed to provide the first and the second semiconductor components 62, 64 include, but are not limited to, Si, SiGe, SiC or a III-V compound semiconductor material. For example, SiC can be used for n-type FinFETs, while SiGe can be used for p-type FinFETs. In this way, the first semiconductor components 62 can create a tensile strain on the n-type FinFETs and a compressive strain on the p-type FinFETs, thereby increasing the performance of the FinFETs.

The first and the second semiconductor components 62, 64 are doped with dopants of a second conductivity type opposite to the first conductivity type of the dopants in the digital alloy layer 20, if present. For example, if the digital alloy layer 20 has a p-type conductivity, n-type dopants can be added to the first and the second semiconductor components 62, 64. If the digital alloy layer 20 has an n-type conductivity, p-type dopants can be added to the first and the second semiconductor components 62, 64. The concentration of the dopants in the first and the second semiconductor components 62, 64 may range from $1.0 \times 10^{18}$ atoms/cm$^3$ to $2.0 \times 10^{21}$ atoms/cm$^3$, although lesser and greater dopant concentrations can also be employed. In one embodiment, the first and the second semiconductor components 62, 64 can be formed with in-situ doping during the selective epitaxy process. Thus, the first and the second semiconductor components 62, 64 can be formed as doped semiconductor material portions. Alternatively, the first and the second semiconductor components 62, 64 can be formed by ex-situ doping. In this case, the first and the second semiconductor components 62, 64 can be formed as intrinsic semiconductor portions and n-type or p-type dopants can be subsequently introduced into the first and the second semiconductor components 62, 64 to convert the intrinsic semiconductor material portions into doped semiconductor material portions.

Figure 7:
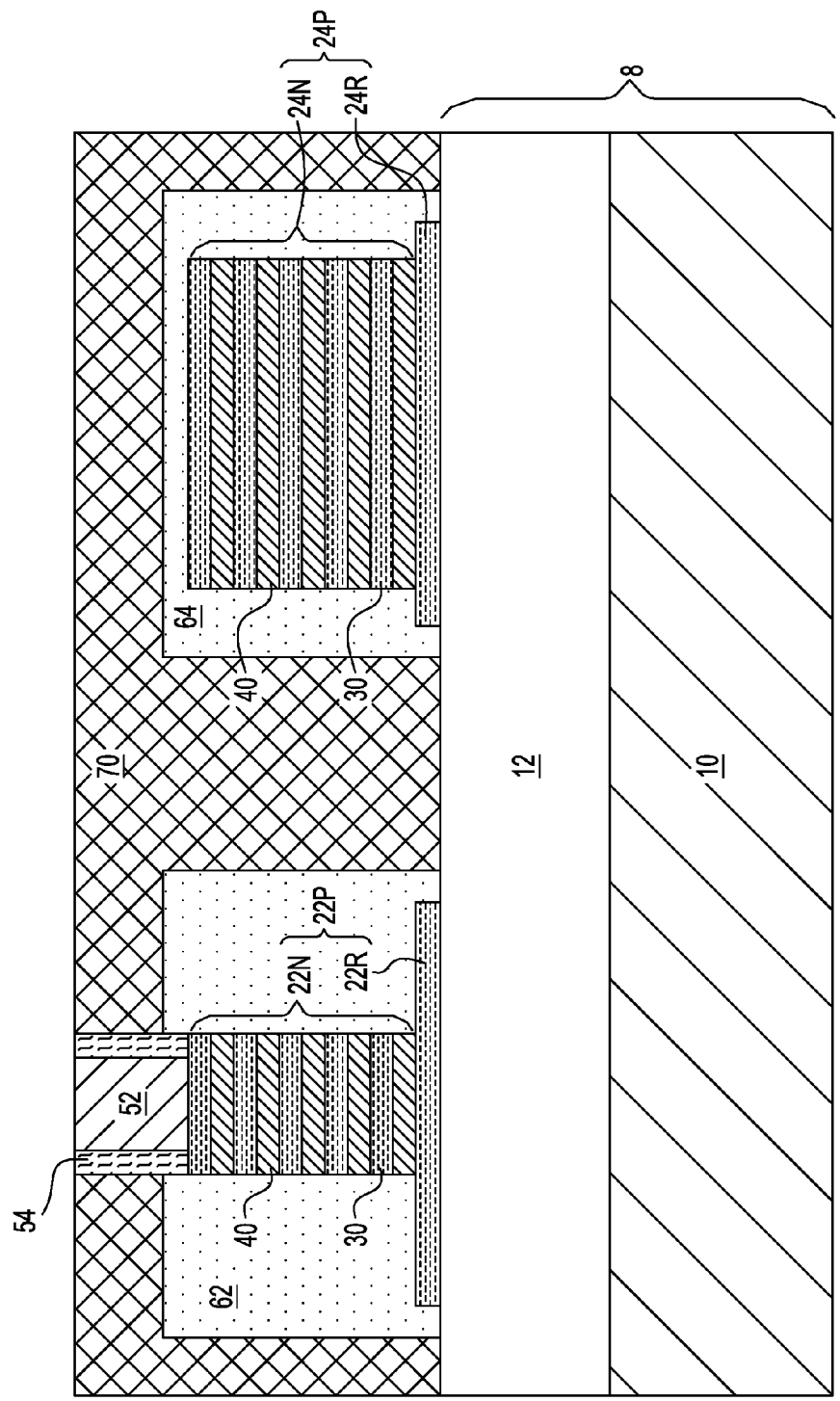
FIG. 7 is a cross-sectional view of the exemplary semiconductor structure of FIG. 6 after forming an interlevel dielectric (ILD) layer over the first and the second semiconductor components and the substrate.

Referring to FIG. 7, an interlevel dielectric (ILD) layer 70 is formed over the first and the second semiconductor components 62, 64 and the buried insulator layer 12. The ILD layer 70 laterally surrounds the sacrificial gate structure (52, 54). In some embodiments of the present application, the ILD layer 70 is composed of a dielectric material that may be easily planarized. For example, the ILD layer 70 can include a doped silicate glass, an undoped silicate glass (silicon dioxide), an organosilicate glass (OSG), a porous dielectric material or amorphous carbon. The ILD layer 70 can be deposited using a conventional deposition process such as, for example, CVD, PECVD or spin coating. If the ILD layer 70 is not self-planarizing, and following the deposition of the ILD layer 70, the ILD layer 70 can be subsequently planarized, for example, by chemical mechanical planarization (CMP) using the topmost surface of the sacrificial gate 52 as an etch stop so that a top surface of the ILD layer 70 is coplanar with the topmost surface of the sacrificial gate 52.

Figure 8:
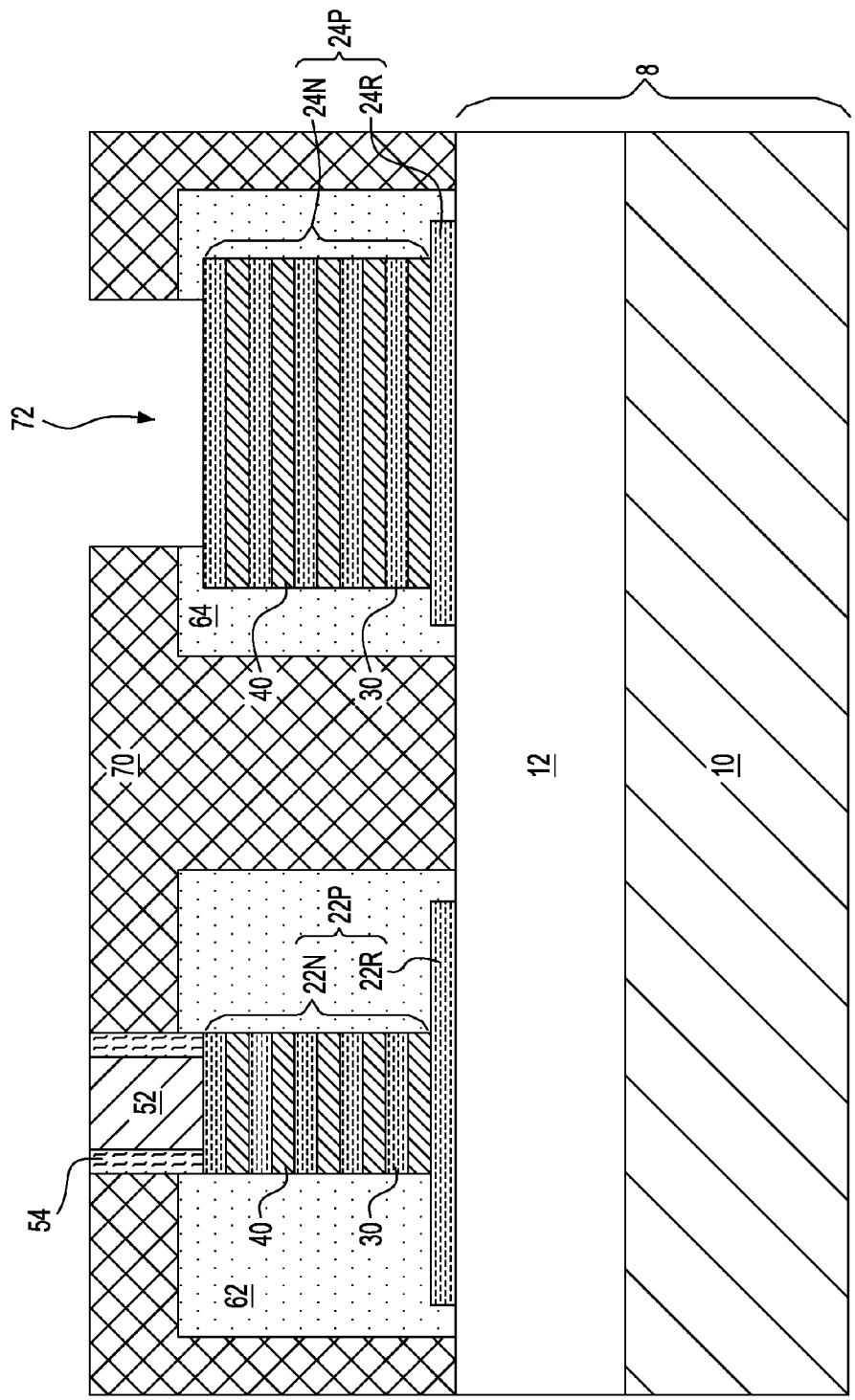
FIG. 8 is a cross-sectional view of the exemplary semiconductor structure of FIG. 7 after forming an opening to expose a portion of a non-recessed portion of the second digital alloy portion.

Referring to FIG. 8, an opening 72 is formed extending through the ILD layer 70 and a horizontal portion of the second semiconductor component 64 that is located on the top surface of the non-recessed portion 24N of the digital alloy resistor portion 24P. The opening 72 exposes at least a portion of the non-recessed portion 24N of the digital alloy resistor portion 24P. The opening 72 can be formed by applying a mask layer (not shown) over the ILD layer 70 and the sacrificial gate structure (52, 54), and then patterning the mask layer to form an opening therein. In one embodiment, the mask layer can be a photoresist layer or a photoresist layer in conjunction with hard mask layer(s). The pattern of the opening in the mask layer is transferred through the ILD layer 70 and the horizontal portion of the second semiconductor component 64 to form the opening 72. An anisotropic etch such as RIE can be performed to remove the dielectric material providing the ILD layer 70 and the semiconductor material providing the second semiconductor component 64 selective to the semiconductor materials providing the digital alloy resistor portion 24P.

In some embodiments of the present application, and in instances where the digital alloy resistor portion 24P is an intrinsic (i.e., non-doped) semiconductor portion, ion implantation may be performed to provide dopants to the digital alloy resistor portion 24P. The ion implantation is optional and can be omitted. After forming the opening 72 and ion implantation, if needed, the remaining portion of the mask layer can be removed by oxygen-based plasma etching.

Figure 9:
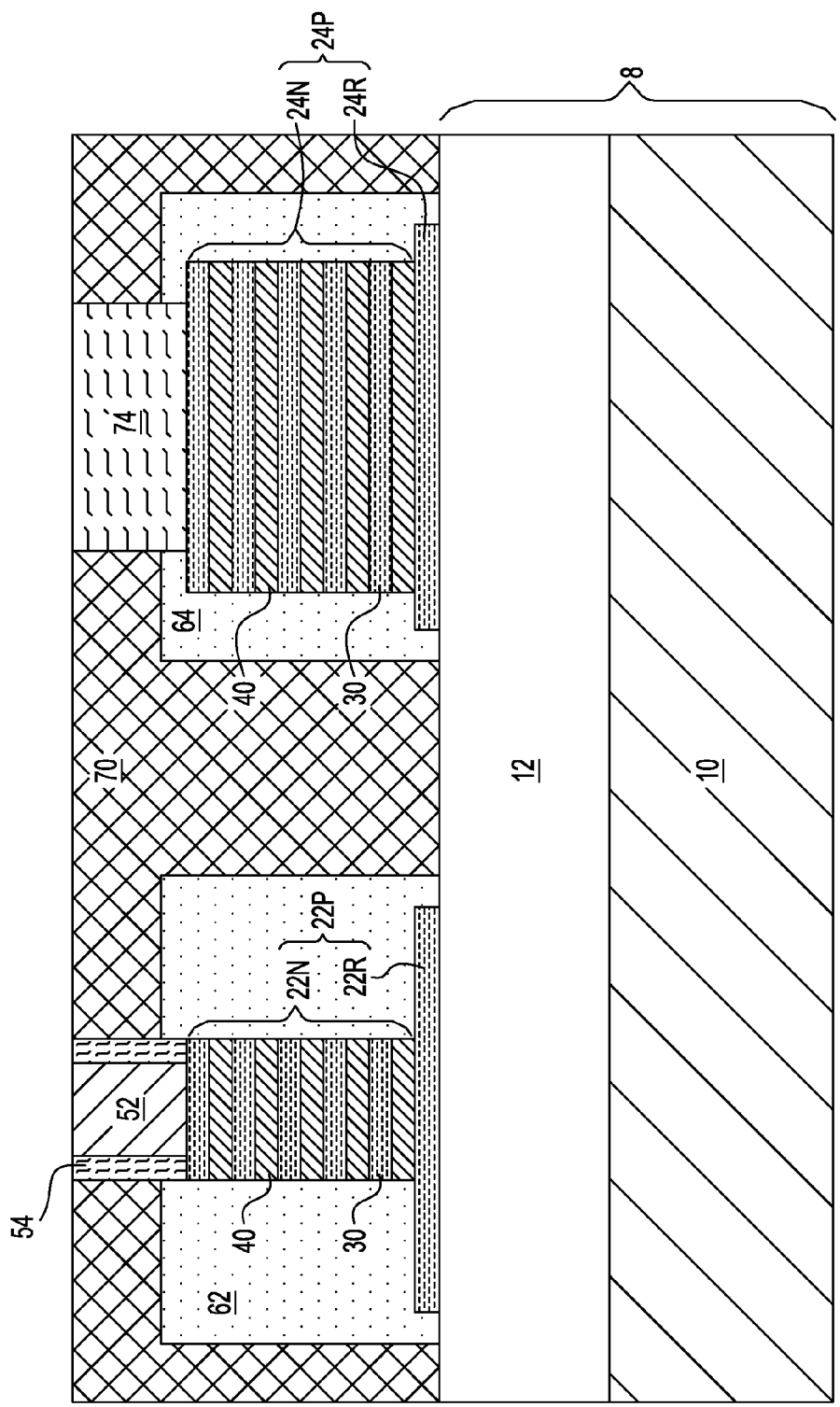
FIG. 9 is a cross-sectional view of the exemplary semiconductor structure of FIG. 8 after forming a dielectric fill portion within the opening.

Referring to FIG. 9, a dielectric fill portion 74 is formed to completely fill the opening 72. The dielectric fill portion 74 can include a dielectric material the same as, or different from, the dielectric material that provides the ILD layer 70. For example, the dielectric fill portion 74 can include doped silicate glass, silicon dioxide, OSG or amorphous carbon. The dielectric fill portion 74 can be formed by CVD or spin coating. The dielectric fill portion 74 can be subsequently planarized by, for example, CMP such that a top surface of the dielectric fill portion 74 is coplanar with the top surface of the ILD layer 70.

Figure 10:
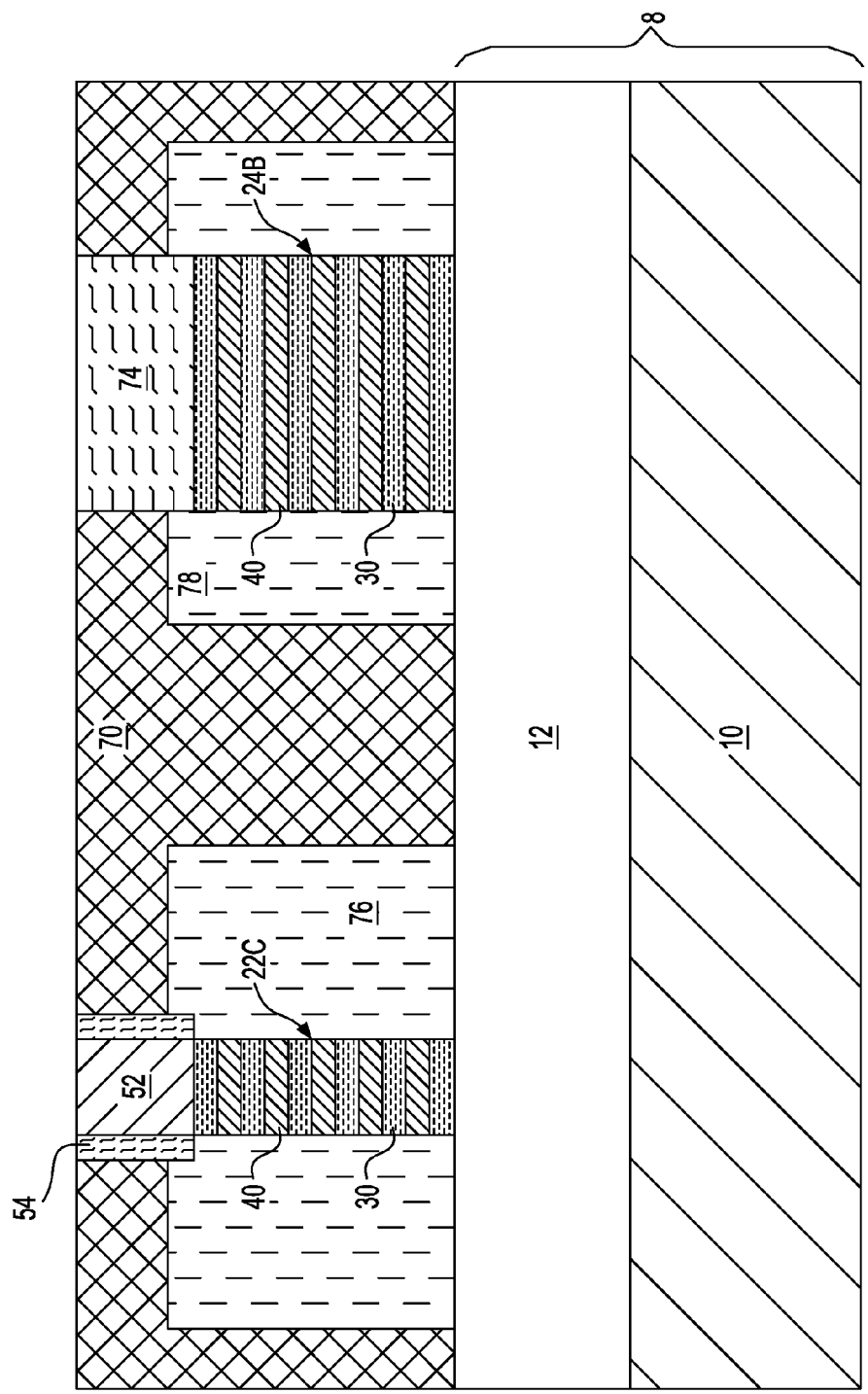
FIG. 10 is a cross-sectional view of the exemplary semiconductor structure of FIG. 9 after forming source/drain regions laterally surrounding a digital alloy channel portion in the active device region, and forming semiconductor resistor contact portions laterally surrounding a digital alloy resistor body portion in the passive device region.

Referring to FIG. 10, dopants in the first semiconductor components 62 are diffused into portions of the digital alloy transistor portion 22P that do not underlie the sacrificial gate 52 to form a source region and a drain region (collectively referred to source/drain regions 76) located on opposite sides of the sacrificial gate 52. A remaining portion of the digital alloy transistor portion 22P that is located beneath the sacrificial gate 52 constitutes a digital alloy channel portion 22C of a FinFET. Simultaneously, dopants in the second semiconductor component 64 are diffused into portions of the digital alloy resistor portion 24P that do not underlie the dielectric fill portion 74 to form semiconductor resistor contact portions 78 located on opposite sides of the dielectric fill portion 74. A remaining portion of the digital alloy resistor portion 24P that is located beneath the dielectric fill portion 74 constitutes a digital alloy resistor body portion 24B. In one embodiment, the outdiffusion of dopants can be effected by an anneal process such as, rapid thermal annealing.

Figure 11:
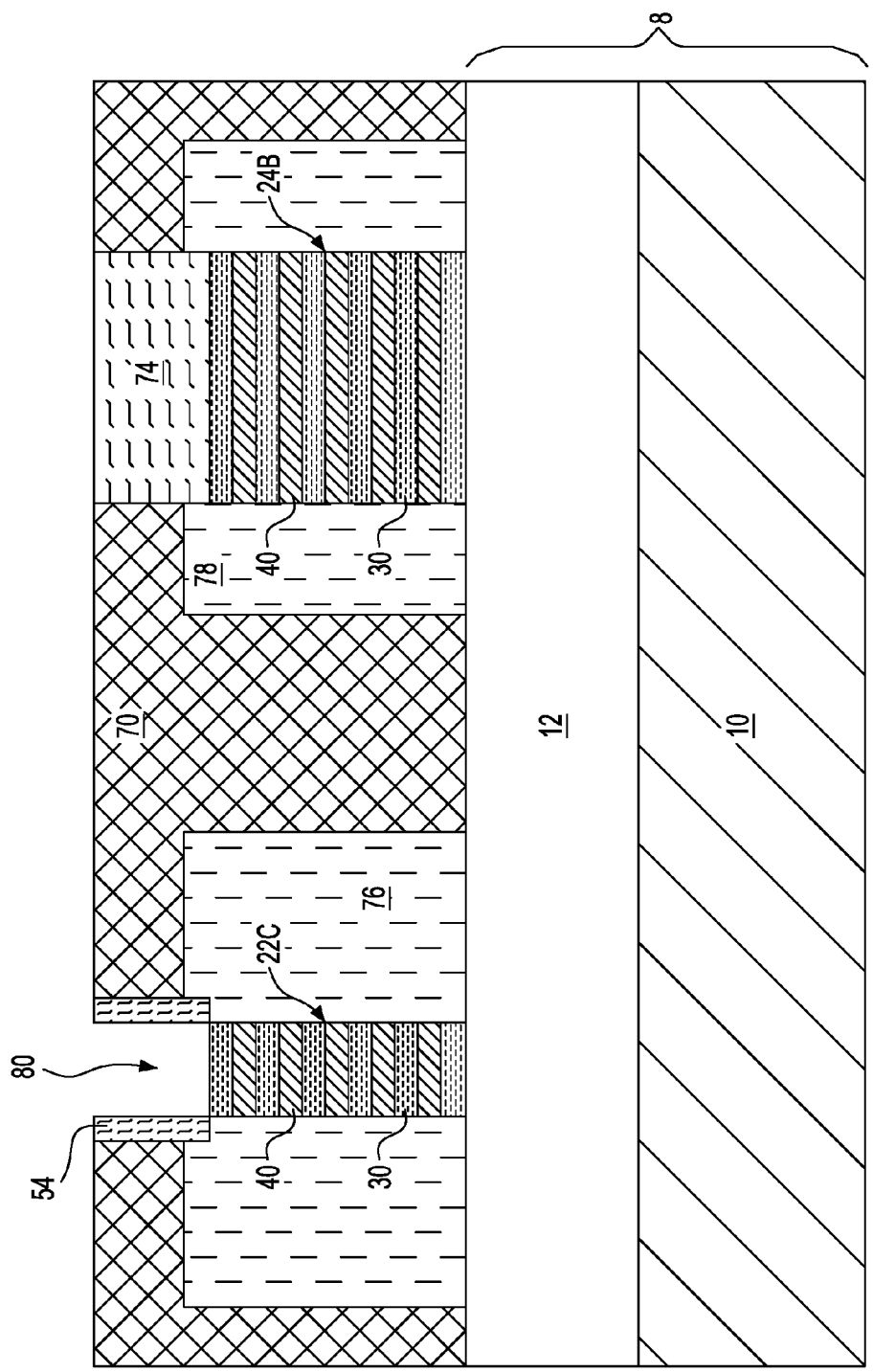
FIG. 11 is a cross-sectional view of the exemplary semiconductor structure of FIG. 10 after removing a sacrificial gate in the sacrificial gate structure to provide a gate cavity.

Referring to FIG. 11, the sacrificial gate 52 is removed to provide a gate cavity 80. Various components of the sacrificial gate 52 can be removed selectively to the semiconductor materials that provide the digital alloy transistor portion 22P and the dielectric materials that provide the gate spacer 54, the ILD layer 70 and the dielectric fill portion 74 utilizing at least one etch. The at least on etch can be a wet etch such as an ammonia etch or a dry etch such as RIE. The gate cavity 80 is thus formed within a volume from which the sacrificial gate 52 is removed and is laterally confined by the inner sidewalls of the gate spacer 54. The gate cavity 80 exposes the digital alloy channel portion 22C that is originally covered by the sacrificial gate 52.

Figure 12:
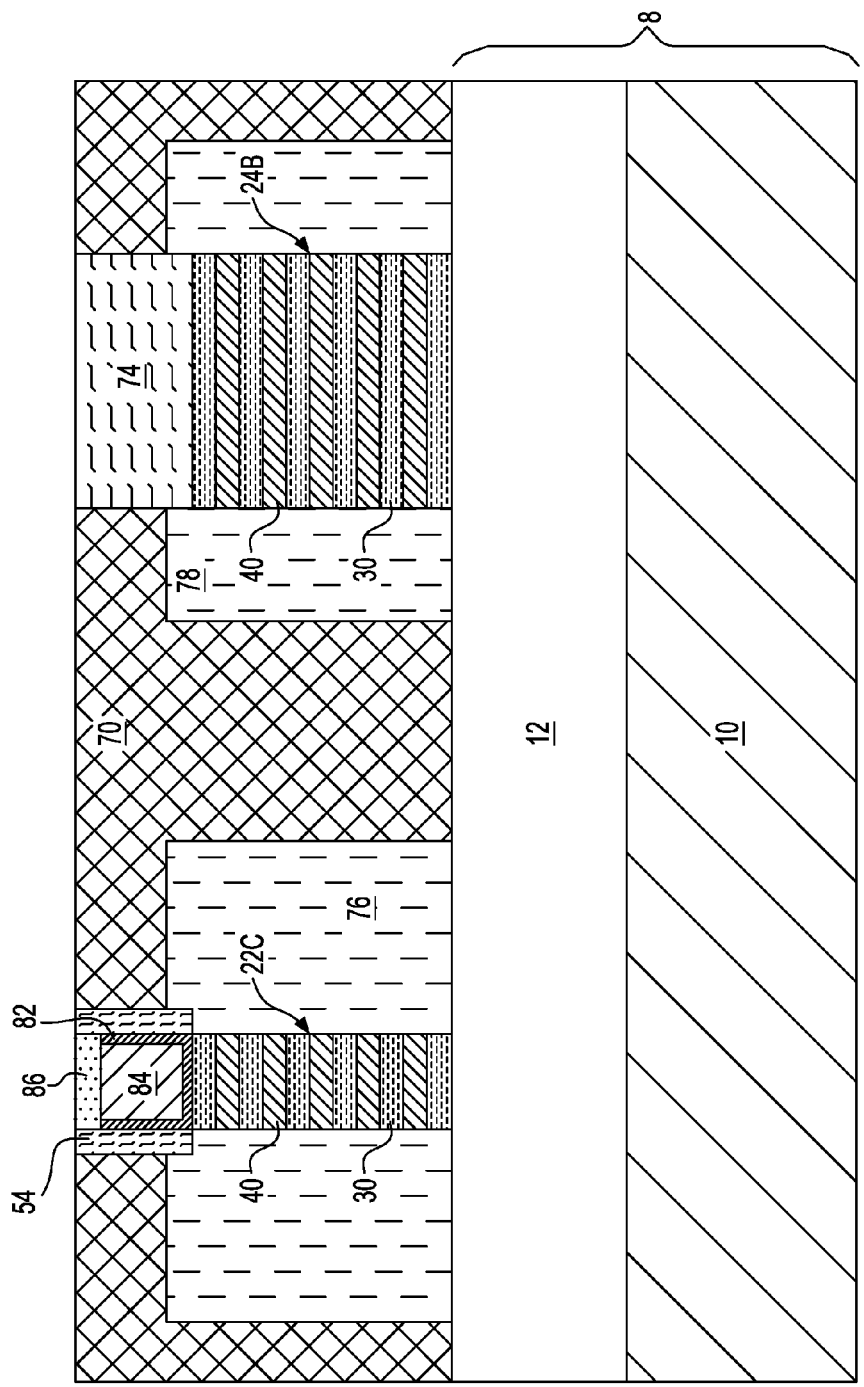
FIG. 12 is a cross-sectional view of the exemplary semiconductor structure of FIG. 11 after forming a metal gate stack in the gate cavity.

Referring to FIG. 12, a metal gate stack is formed within the gate cavity 80 straddling the digital alloy channel portion 22C. The metal gate stack includes, from bottom to top, a gate dielectric 82, a metal gate electrode 84 and a gate cap 86. The metal gate stack (82, 84, 86) and the gate spacer 54 together constitute a functional gate structure.

The metal gate stack (82, 84, 86) can be formed by first depositing a conformal gate dielectric layer (not shown) on sidewalls and a bottom surface of the gate cavity 80. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$ and $Y_2O_3$. In one embodiment, the gate dielectric layer includes $HfO_2$. The gate dielectric layer can be formed by a conventional deposition process including, but not limited to, CVD, PVD and atomic layer deposition (ALD). The gate dielectric layer that is formed may have a thickness ranging from 0.9 nm to 6 nm, although lesser and greater thicknesses can also be employed. The gate dielectric layer may have an effective oxide thickness on the order of or less than 1 nm.

The remaining volume of the gate cavity 80 is then filled with a metal gate electrode layer (not shown). Exemplary metals that can be employed in the metal gate electrode layer include, but are not limited to, tungsten, titanium, tantalum, aluminum, nickel, ruthenium, palladium and platinum. In one embodiment, the metal gate electrode layer is comprised of tungsten. The metal gate electrode layer can be formed utilizing a conventional deposition process including, for example, CVD, PECVD, PVD, sputtering, chemical solution deposition and ALD.

In some embodiment of the present application, and prior to the formation of the metal gate electrode layer, a work function metal layer (not shown) may be conformally deposited over the gate dielectric layer employing CVD, sputtering or plating. The work function metal layer includes a metal having a work function suitable to tune the work function of FinFETs subsequently formed. The thickness of the work function metal layer can be from 3 nm to 15 nm, although lesser and greater thicknesses can also be employed.

The portion of the metal gate electrode layer formed above the top surfaces of the gate spacer 54, the ILD layer 70 and the dielectric fill portion 74 can be removed, for example, by CMP. The portion of the gate dielectric layer that is formed above the top surfaces of the gate spacer 54, the ILD layer 70 and the dielectric fill portion 74 may also be subsequently removed. In some embodiments and as illustrated, the remaining portions of the metal gate electrode layer and the remaining portions of the gate dielectric layer may be recessed utilizing a dry etch or a wet etch to provide a void (not shown) in the gate cavity 80. The remaining portion of the metal gate electrode layer constitutes the metal gate electrode 84, and the remaining portion of the gate dielectric layer constitutes the gate dielectric 82.

A dielectric material is then deposited over the gate dielectric 82 and the metal gate electrode 84 in the gate cavity 80 to completely fill the void. The deposited dielectric material is then planarized, for example, by CMP using the top surface of the ILD layer 70 as an etch stop to form the gate cap 86 such that the top surface of the gate cap 86 is coplanar with the top surface of the ILD layer 70. In one embodiment, the gate cap 86 may include silicon nitride.

Thus, at least one FinFET is formed in the active device region of the substrate 8 and at least one resistor is formed in the passive device region of the substrate 8. Each FinFET includes a digital alloy channel portion 22C composed of alternating sublayers of a first semiconductor material and a second semiconductor material, source/drain regions 76 laterally surrounding the digital alloy channel portion 22C, and a functional gate structure including a metal gate stack (82, 84, 86) straddling the digital alloy channel portion 22C and a gate spacer present on sidewalls of the metal gate stack (82, 84, 86). In the present application, since the digital alloy possesses superior channel mobility as compared to a traditional random alloy, the FinFET formed with the digital alloy channel exhibits improved device performance.

Each resistor includes a digital alloy resistor body portion 24B composed of alternating sublayers of a first semiconductor material and a second semiconductor material and semiconductor resistor contact portions 78 located on opposite sides of the digital alloy resistor body portion 24B. In the present application, since the digital alloy possesses higher thermal conductivity, thus better heat dissipation than that of the traditional random alloy, the resistor exhibits improved temperature coefficient of resistance compared to the resistor made of a random alloy of the same average composition.

Moreover, since the process flow for formation of the resistors is compatible with the process flow for formation of the FinFETs, the integration approach of the present application does not result in a significant increase in manufacturing cost.

Figure 13:
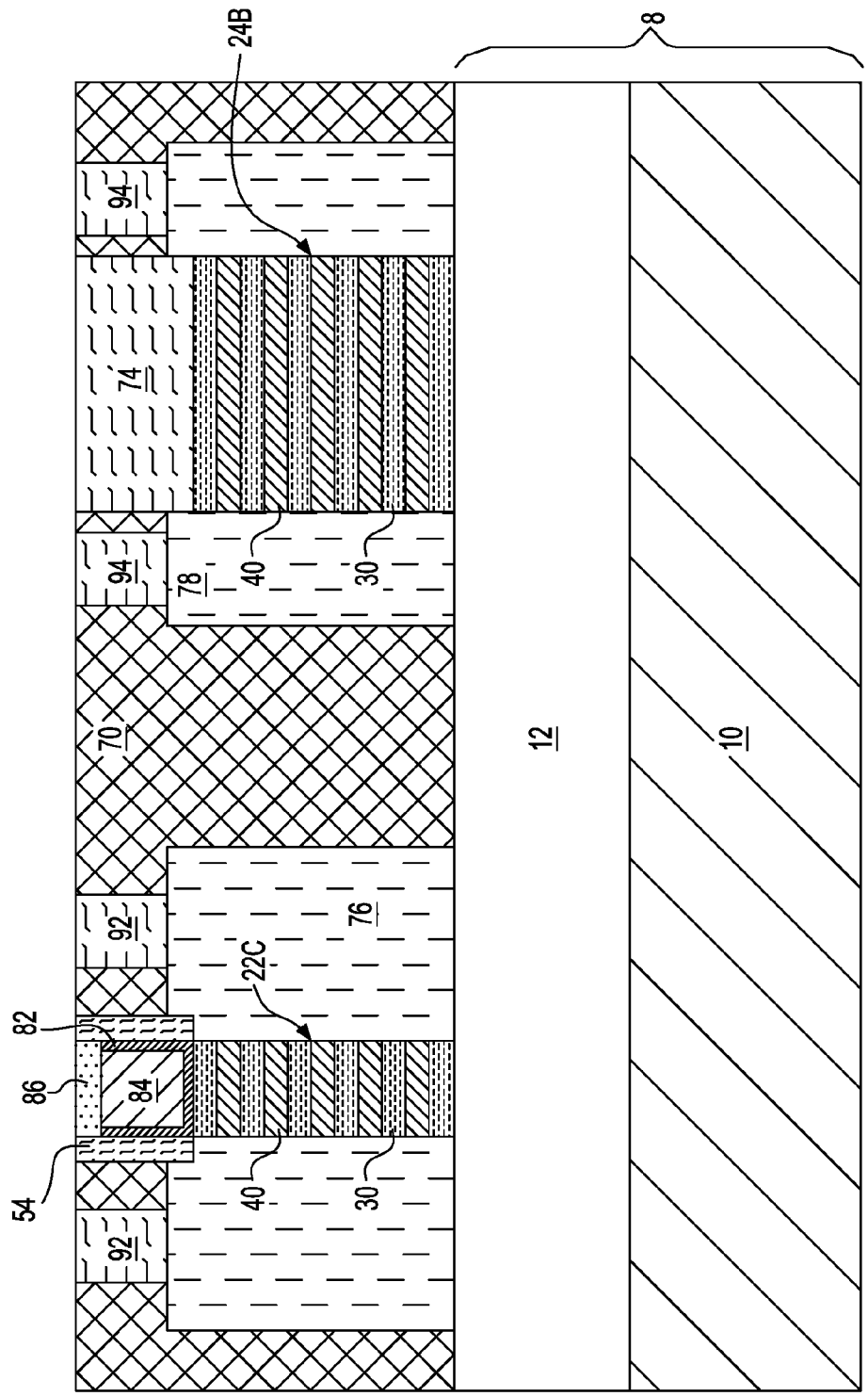
FIG. 13 is a cross-sectional view of the exemplary semiconductor structure of FIG. 12 after forming source/drain contact structures and resistor contact structures.

Referring to FIG. 13, source/drain contact structures 92 are formed to provide electrical connection to the source/drain regions 76, and resistor contact structures 94 are formed to provide electrical connection to the digital alloy resistor body portion 24B. Each source/drain contact structure 92 extends through the ILD layer 70 to form contact with the one of the source/drain regions 76. Each resistor contact structure 94 extends through the ILD layer 70 to form contact with one of the semiconductor resistor contact portions 78. The source/drain and resistor contact structures 92, 94 can be formed by formation of contact openings (not shown) in the ILD layer 70 utilizing a combination of lithographic patterning and anisotropic etch followed by deposition of a conductive material (e.g., copper) and planarization that removes an excess portions of the conductive material from above the top surface of the ILD layer 70. Optionally, contact liners (not shown) may be formed on the sidewalls and bottoms surfaces of the contact openings before filling the contact openings with the conductive material. The contact liners may include TiN.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a fin field effect transistor (FinFET) located in a first region of a substrate and comprising:
      a digital alloy channel portion comprising alternating sublayers of a first semiconductor material and a second semiconductor material different from the first semiconductor material, and
      source/drain regions laterally surrounding the digital alloy channel portion; and
   a resistor located in a second region of the substrate and comprising:
      a digital alloy resistor body portion comprising alternating sublayers of the first semiconductor material and the second semiconductor material, and
      semiconductor resistor contact portions laterally surrounding the digital alloy resistor body portion.

2. The semiconductor structure of claim 1, wherein each of the first semiconductor material and the second semiconductor material comprises Si or Ge.

3. The semiconductor structure of claim 1, wherein each of the first semiconductor material and the second semiconductor material comprises InAs, GaAs or AlAs.

4. The semiconductor structure of claim 1, wherein each of the source/drain regions and the semiconductor resistor contact portions comprises a semiconductor component and alternating sublayers of the first semiconductor material and the second semiconductor material.

5. The semiconductor structure of claim 1, further comprising a functional gate structure, wherein the functional gate structure comprises a metal gate stack straddling the digital alloy channel portion and a gate spacer located on sidewalls of the metal gate stack.

6. The semiconductor structure of claim 5, wherein the metal gate stack comprises a gate dielectric, a metal gate electrode and a gate cap.

7. The semiconductor structure of claim 1, further comprising source/drain contact structures contacting the source/drain regions, and resistor contact structures contacting the semiconductor resistor contact portions.

8. The semiconductor structure of claim 1, wherein the substrate comprises a handle substrate and a buried insulator layer overlying the handle substrate, wherein the FinFET and the resistor are located on the buried insulator layer.

9. The semiconductor structure of claim 1, wherein a bottommost sublayer and a topmost sublayer in the alternating sublayers comprise a same semiconductor material.

10. A method of forming a semiconductor structure comprising:
   forming a fin field effect transistor (FinFET) in a first region of a substrate and a resistor in a second region of the substrate,
   wherein the FinFET comprises:
      a digital alloy channel portion comprising alternating sublayers of a first semiconductor material and a second semiconductor material different from the first semiconductor material, and
      source/drain regions laterally surrounding the digital alloy channel portion; and
   wherein the resistor comprises:
      a digital alloy resistor body portion comprising alternating sublayers of the first semiconductor material and the second semiconductor material, and
      semiconductor resistor contact portions laterally surrounding the digital alloy resistor body portion.

11. The method of claim 10, wherein each of the first semiconductor material and the second semiconductor material comprises Si or Ge.

12. The method of claim 10, wherein each of the first semiconductor material and the second semiconductor material comprises InAs, GaAs or AlAs.

13. The method of claim 10, wherein the forming the FinFET and the resistor comprises:
   forming a first digital alloy portion in the first region of a substrate and a second digital alloy portion in the second region of the substrate;
   forming a sacrificial gate structure straddling a portion of the first digital alloy portion;
   forming a mask layer portion over a central portion of the second digital alloy portion;
   recessing portions of the first digital alloy portion that are exposed by the sacrificial gate structure and portions of the second digital alloy portion that are exposed by the mask layer portion;
   removing the mask layer portion to expose a top surface of a non-recessed portion of the second digital alloy portion;
   forming first semiconductor components over the recessed portions of the first digital alloy portion and a second semiconductor component over the recessed portions and the non-recessed portion of the second digital alloy portion;
   forming an interlevel dielectric (ILD) layer over the first semiconductor components and the second semiconductor component, wherein the ILD layer laterally surrounds the sacrificial gate structure;
   forming a dielectric fill portion laterally surrounded by the ILD layer and contacting at least a portion of the non-recessed portion of the second digital alloy portion; and
   diffusing dopants from the first semiconductor components into portions of a remaining portion of the first digital portion that are not covered by a sacrificial gate in the sacrificial gate structure to form the source/drain regions and diffusing dopants from the second semiconductor component into portions of a remaining portion of the second digital portion that are not covered by the dielectric fill portion to forming the semiconductor resistor contact portions.

14. The method of claim 13, wherein each of the first digital alloy portion and the second digital alloy portion comprises alternating sublayers of the first semiconductor material and the second semiconductor material.

15. The method of claim 14, wherein the forming the first digital alloy portion and the second digital alloy portion comprises:
   forming a digital alloy layer comprising alternating sublayers of the first semiconductor material and the second semiconductor material over the substrate; and
   patterning the digital alloy layer.

16. The method of claim 14, further comprising forming an opening extending through the ILD layer and a portion of the second semiconductor component that is located over the non-recessed portion of the second digital alloy portion to expose at least the portion of the non-recessed portion of the second digital alloy portion prior to the forming the dielectric fill portion.

17. The method of claim 16, further comprising depositing a dielectric material within the opening to form the dielectric fill portion.

18. The method of claim 17, further comprising implanting dopants into the second digital alloy portion through the opening prior to the forming the dielectric fill portion.

19. The method of claim 13, further comprising replacing the sacrificial gate with a metal gate stack.

20. The method of claim 13, further comprising forming source/drain contact structures extending through the ILD layer and contacting the source/drain regions and forming resistor contact structures extending through the ILD layer and contacting the semiconductor resistor contact portions.

* * * * *